United States Patent [19]
Ameen et al.

[11] Patent Number: 5,907,903
[45] Date of Patent: Jun. 1, 1999

[54] MULTI-LAYER-MULTI-CHIP PYRAMID AND CIRCUIT BOARD STRUCTURE AND METHOD OF FORMING SAME

[75] Inventors: Joseph George Ameen, Newark, Del.; Joseph Funari, Vestal, N.Y.

[73] Assignee: International Business Machines Corporation, Armonk, N.Y.

[21] Appl. No.: 09/004,523

[22] Filed: Jan. 8, 1998

Related U.S. Application Data

[62] Division of application No. 08/653,092, May 24, 1996, Pat. No. 5,715,144.

[51] Int. Cl.⁶ ........................................................ H05K 3/36
[52] U.S. Cl. .................. 29/830; 228/179.1; 228/180.21; 228/180.22; 361/735; 361/743; 361/744; 361/746
[58] Field of Search ............................. 29/830, 846, 852; 361/790, 735, 743, 744, 746; 228/179.1, 180.21, 180.22; 257/723, 686

[56] References Cited

U.S. PATENT DOCUMENTS

| | | |
|---|---|---|
| 4,499,607 | 2/1985 | Higgins . |
| 4,801,992 | 1/1989 | Golubic . |
| 4,807,021 | 2/1989 | Okumura . |
| 5,016,138 | 5/1991 | Woodman . |
| 5,019,946 | 5/1991 | Eichelberger et al. . |
| 5,107,586 | 4/1992 | Eichelberger et al. . |
| 5,109,601 | 5/1992 | McBride . |
| 5,222,014 | 6/1993 | Lin . |
| 5,239,448 | 8/1993 | Perkins et al. . |
| 5,247,423 | 9/1993 | Lin et al. . |
| 5,285,352 | 2/1994 | Pastore et al. . |
| 5,397,921 | 3/1995 | Karnezos . |
| 5,399,898 | 3/1995 | Rostoker . |
| 5,454,160 | 10/1995 | Nickel . |
| 5,715,144 | 2/1998 | Ameen et al. . |

FOREIGN PATENT DOCUMENTS

| | | |
|---|---|---|
| 274-129 | 12/1989 | Germany . |
| 58-92230 | 6/1983 | Japan . |
| 4-290258 | 10/1992 | Japan . |
| 5-82710 | 4/1993 | Japan . |
| 5-335633 | 12/1993 | Japan . |

*Primary Examiner*—Carl J. Arbes
*Attorney, Agent, or Firm*—Calfee, Halter & Griswold LLP

[57] ABSTRACT

The present invention provides multi-layer multi-chip circuit board comprising at least two ATAB carriers having chips thereon, stacked upon each other in a pyramid configuration and attached to a substrate, thus reducing the required area on the substrate for mounting components to form a circuit board.

11 Claims, 4 Drawing Sheets

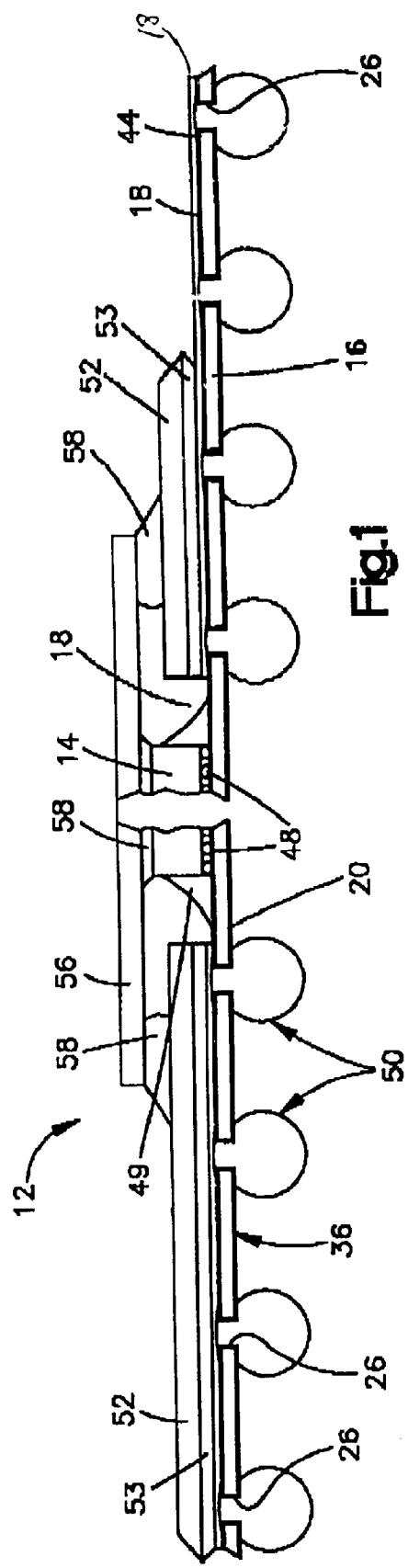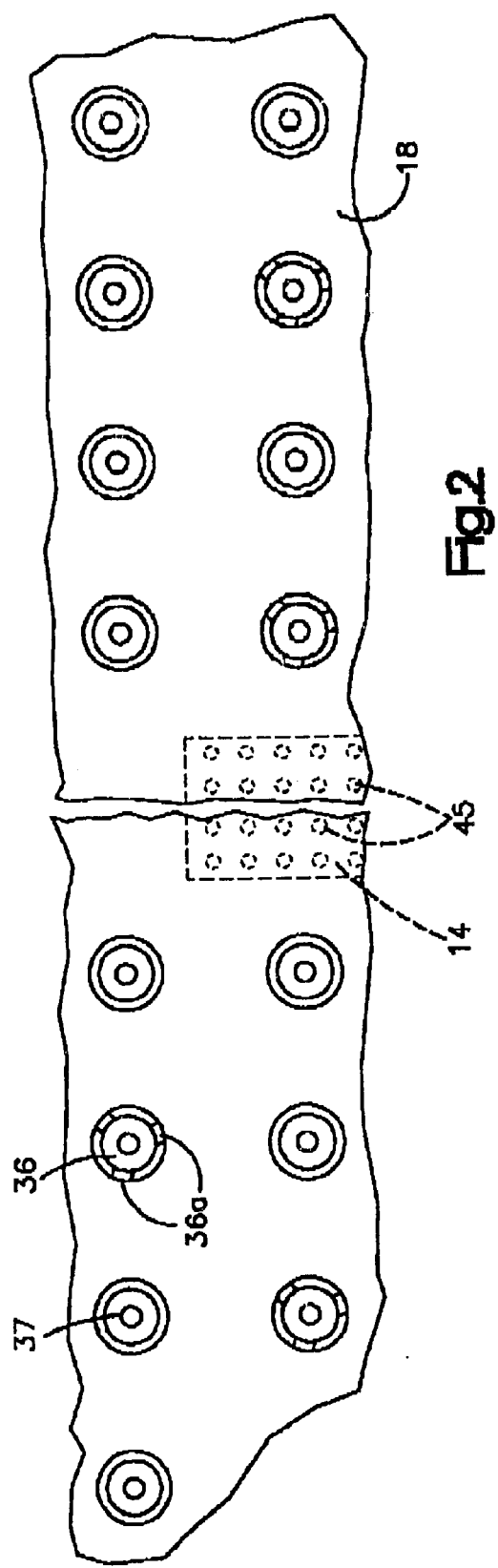

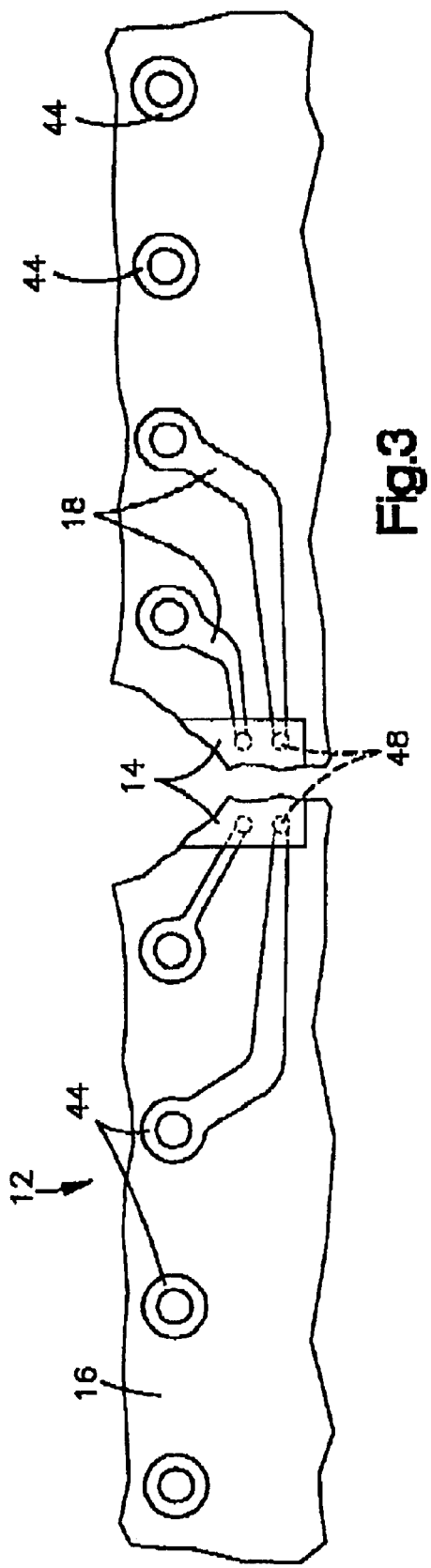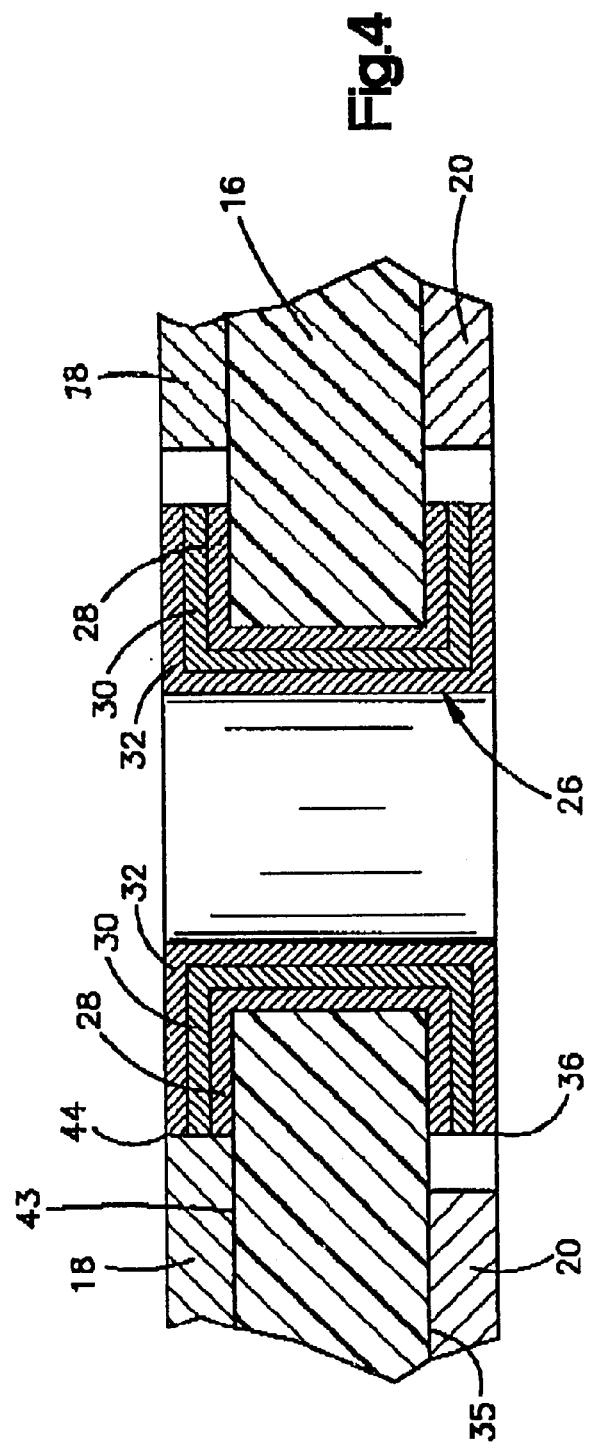

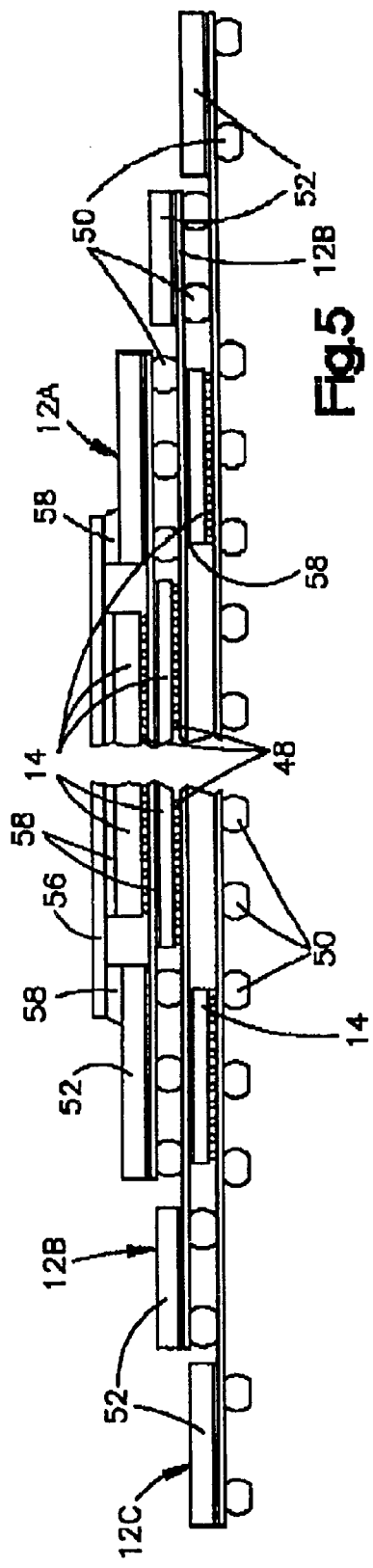
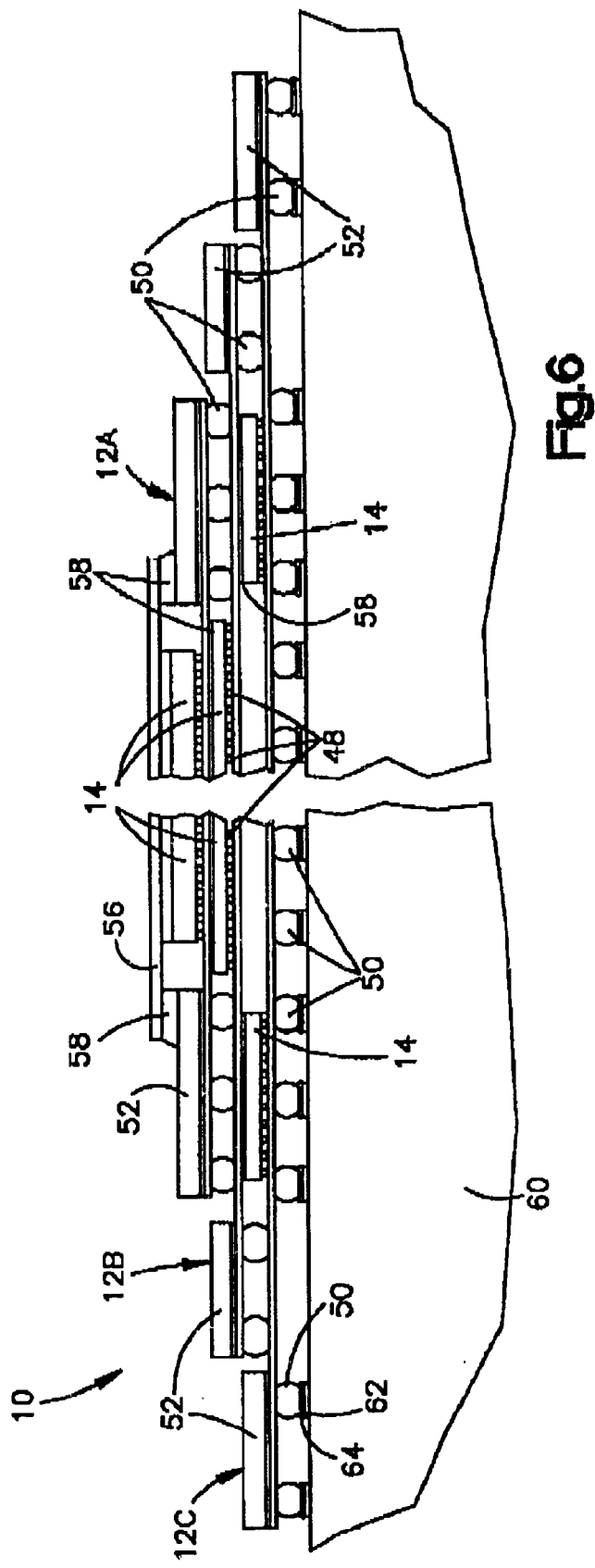

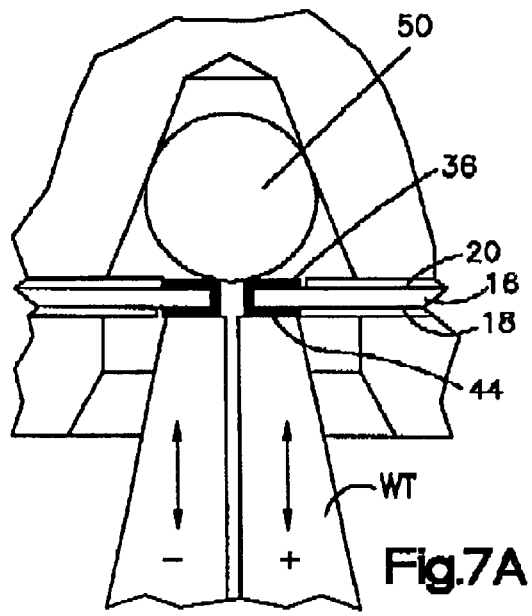
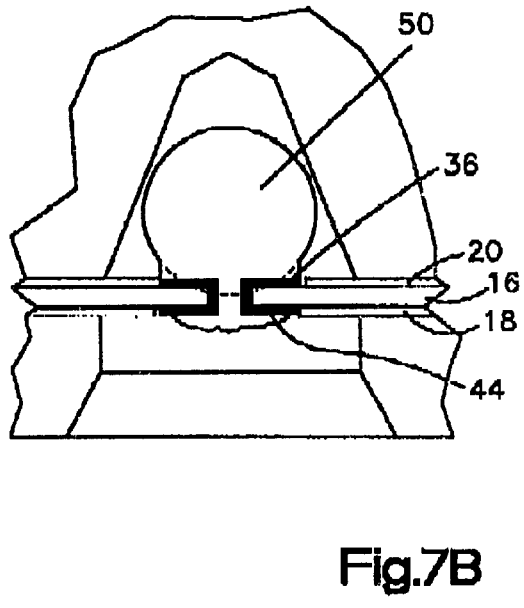
Fig.7A    Fig.7B
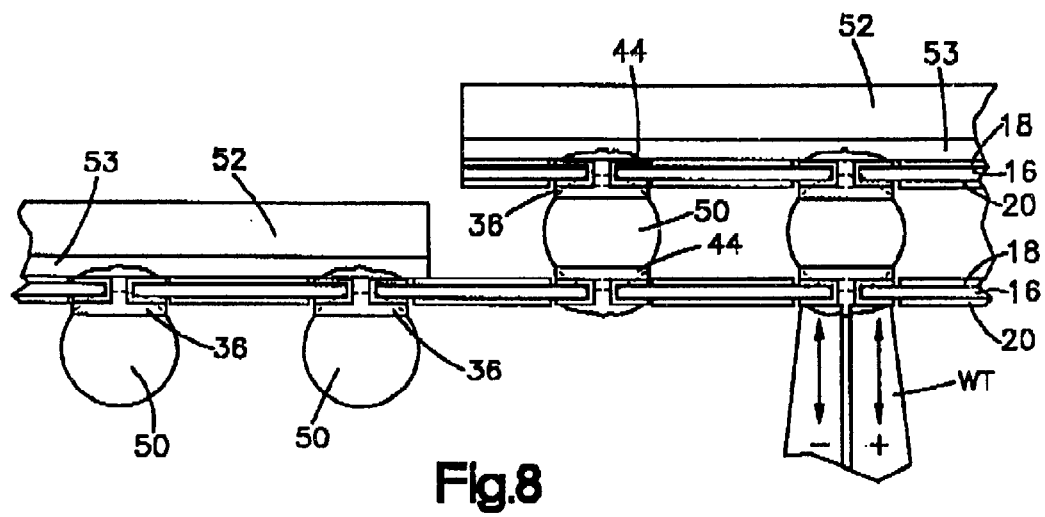
Fig.8

MULTI-LAYER-MULTI-CHIP PYRAMID AND CIRCUIT BOARD STRUCTURE AND METHOD OF FORMING SAME

This application is a Divisional of 08/653,092, filed May 24, 1996, now U.S. Pat. No. 5,715,144.

BACKGROUND OF THE INVENTION

Direct chip attachment (DCA) of integrated circuit chips, to an underlying circuit board used in computers or the like presents several problems. Differences in coefficients of thermal expansion (CTE) between the chip, which is typically made of silicon, and the circuit board, which is typically made of organic material such as fiberglass filled epoxy often lead to failed connections. Also it is difficult to remove a chip that is directly attached to a circuit board during reworking if chip failure is noted during testing.

A number of solutions for connecting chips to circuit boards have evolved. In one such solution, the chip is connected to a chip carrier which in turn is connected to the circuit board. Employing carriers, especially with a CTE between that of the chip and that of the carrier, relieves the problems associated with differential coefficients of expansion and provides a modular component system that permits easy removal of a deficient chip from the circuit board during reworking of the board. Moreover, if the same material is used as a carrier as for the circuit board, the effect of CTE mismatch is minimized because the carrier is much smaller than the board.

One such carrier system, tape automated bonding (known as ATAB), often is used to connect I/C chips to circuit boards. An ATAB is comprised of a thin film of dielectric material, and a ground plane, typically a thin layer of copper, plated or laminated to the thin film. Atop the thin film, circuitization for connecting the I/C chip and distributing signals to and from the chip, has been laid. One or more I/C chips are attached to the top surface of the ATAB in accordance with the circuitization design. Plated vias are formed through the film to connect the top of the film of material to the bottom of the film of material. Attachment pads communicate with the vias on the ground plane surface but are electrically insulated therefrom. Solder balls are disposed on the pads for connecting the ATAB to the underlying circuit board.

Employing ATAB carrier technology improves the connection of the chip to the underlying circuit board and provides the convenience of modular parts. However, the ATAB carriers occupy additional space in relationship to the size of the chip when disposed on the circuit board. Thus, a large area of circuit board may be required to connect all of the necessary I/C chips. Also, ATABs do not remain flat; and this leads to warpage.

It would be desirable to have structures and methods for making structures that requires less surface area on the substrate for maintaining a given number of I/C chips using ATAB technology.

SUMMARY OF THE INVENTION

The present invention provides multi-layer multi-chip circuit board comprising at least two ATAB carriers having chips thereon, stacked upon each other in a pyramid configuration and attached to a substrate, thus reducing the required area on the substrate for mounting components to form a circuit board structure.

BRIEF DESCRIPTION OF THE DRAWINGS

FIG. 1 is a longitudinal fragmentary sectional view of a portion of a multi-chip ATAB carrier;

FIG. 2 is a bottom fragmentary view of the multi-chip ATAB carrier;

FIG. 3 is a top fragmentary view of the multi-chip ATAB carrier;

FIG. 4 is a cross-sectional view of a portion of a multi-chip ATAB carrier showing the metallization;

FIG. 5 is a longitudinal fragmentary sectional view of a portion of a multi-chip, multi-layer ATAB carrier, according to this invention;

FIG. 6 is a longitudinal sectional view of a portion of a multi-chip multi-layer ATAB chip carrier mounted on a circuit board, according to this invention;

FIGS. 7A and 7B are sectional views showing diagrammatically progressive steps for attachment of solder balls to the ATAB carrier by solder reflow; and FIG. 8 is a longitudinal sectional detailed view showing the assembly of the multi-chip, multi-layer ATAB carrier.

DETAILED DESCRIPTION OF THE INVENTION

The present invention provides a multi-layer multi-chip circuit board structure comprising at least two ATABs having integrated circuit (I/C) chips thereon, stacked upon each other in a pyramid configuration mounted on a circuit board or other similar substrate thus increasing the available area for mounting components on a substrate. The invention also relates to a process for making the multi-chip, multi-layer circuit board structure.

The multi-chip, multi-layer ATAB carrier, also sometimes referred to herein as the "pyramid", comprises at least two ATAB carriers, one of which is "stacked" atop the other, with the bottom most ATAB carrier being mounted on a substrate such as a printed circuit board or card.

Referring now to FIG. 1, a typical ATAB carrier designated generally as 12 is shown which contains multiple integrated circuit (I/C) chips one of which is shown at 14. As can best be seen in FIGS. 4 and 8, the ATAB carrier 12 comprises a thin film 16, having a thickness of, for example, about 2 mils, formed of a dielectric material such as, for example polyethylene terphthalate, available under the trademark "Mylar" from E.I. duPont Corp., or of a polyimide, available under the trademark "Kapton", from E.I. duPont Corp. The thin film 16 is sandwiched between two metal layers, preferably, a top layer 18 and a bottom or ground plane layer 20. The top layer 18, (seen more clearly in FIG. 3), is patterned to form circuits as desired in a conventional manner, e.g. using photolithographic techniques. The ground plane layer 20 is preferably comprised of about a 0.7 mil layer of copper which is plated, or laminated, to the dielectric material 16. Vias 26 extends through the ATAB carrier 12, and are preferably spaced on 50 mil centers. Disposed on surface 35 of ATAB carrier 12 are pads 36 and 37 (see FIG. 2) which extend across vias 26; preferably, the pads 36 and 37 are about 0.7 mil thick and about 16 mil in diameter. As shown in FIG. 4, the vias 26 and pads 36 and 37 are plated through with metallization which preferably comprises about a 0.7 mil layer 28 of copper, about a 15–30 micro inch layer 30 of nickel, disposed atop the copper layer 28, and about a 15–20 micro inch layer 32 of gold disposed atop the nickel layer 30. Pads 36 are connected to the ground plane 20 by tabs 36a and pads 37 are isolated from the ground plane 20, depending on the circuitization design as shown in FIG. 2.

The ATAB further comprise pads 44 disposed across-surface of vias 26 on surface 43 of the ATAB 12; some pads 44 serve as the connection point with solder balls on adjacent ATABs within the pyramid 10, depending on physical layout and circuitization design.

Referring again to FIG. 1, the conventional integrated circuit chips 14 have chip solder balls 48 disposed on one surface thereby in a pattern known as the chip footprint to join the chips 14 to an underlying substrate. Chip solder balls 48 are attached to pads 45 on the surface of the metallization layer 18 which are formed in the pattern to correspond to the chips footprint (see FIGS. 2 and 3). Chips 14 are preferably encapsulated with conventional encapsulant 49.

Disposed on pads 36 and 37 the bottom surface 35 of the ATAB carriers 12 are solder balls 5 comprised of a high melting point solder such as for example, a solder comprised of 10% tin and 90% lead, known as "10/90" solder, or of 5% tin and 95% lead, known as "5/95" solder. The 10/90 solder typically has a melting point of about 287° C. plus or minus 2° C. The 5/95 solder typically has a melting point of about 312° C. plus or minus 2° C. The solder balls 50 are preferably about 20 mils to about 22 mils in diameter. Solder balls 50 are joined to the gold layer 32 on the pads 36 and 37 on the bottom surface 35 of the ATAB 12. These solder balls will provide the connection of the ATAB carrier 12 to the next underlying ATAB carrier.

Preferably, stiffeners 52 are disposed on the ATAB carrier 12, preferably the top surface 54 of the ATAB carrier 12, to keep the ATAB carrier 12 flat. The stiffeners 52 may be made of a variety of materials, copper; nickel; stainless steel, etc., and including various dielectric material such as glass filled epoxy of the type used in circuit boards, or molded plastic, e.g., polyimide, polytetrafluorine ethylene, etc. Stiffeners 52 are attached to ATAB carrier 12 preferably with polyamide tape adhesive 53. If a heat sink for the chip 14 is desired, a thin strip of copper 56 may be bonded to the top of the chip 14, and to the top of stiffeners 52 with a thermally conductive adhesive 58 such as a thermal epoxy preferably containing about 60% zinc oxide from 2 to 4 mil thick. A suitable thermal epoxy is disclosed in U.S. Pat. No. 5,028,984, "Epoxy composition and use Thereof", issued Jul. 21, 1991, to Ameen et. al., which is incorporated herein by reference. Alternatively, as shown in FIG. 5, the top of the chips 14 are coated with a thermal adhesive 58 and bonded directly to the bottom surface 35 of the next adjacent ATAB carrier 12.

FIG. 5 shows pyramid 10, comprised of a plurality of ATAB carriers 12A, 12B and 12C having similar construction to the ATAB carrier in FIG. 1 although the circuitization and chip placement will be specific to each to allow for pyramiding interconnection. ATAB carriers 12A, 12B, and 12C have chips 14 received thereon with solder balls 48. The solder balls 50 disposed on pads 36 and 37 of ATAB carrier are affixed to pads 44 (see FIG. 8) on the top surface of the next underlying ATAB carrier 12 within the pyramid.

Referring now to FIG. 6, the pyramid 10 is shown attached to circuit board 60. The circuit board 60 has pads 62 disposed on the top surface aligned with the solder balls 50 on the bottom of the pyramid 10. A reflowed solder paste 64, a tin-lead solder, is located atop the pads 62. This low melting solder paste 64, also known as "60-40" solder, has a melting point below that of the solder balls 48 and 50; preferably the melting point is about 160° C. Solder balls 50 are attached to solder paste 64 on pads 62 on board 60 in a manner to be described presently.

Process for Making the Multi-Chip, Multi-Layer Circuit Boards

First, at least two ATAB carriers 12 are provided; preferably each of the ATAB carriers 12 contain multiple I/C chips 14 mounted thereon. While a preferred ATAB carrier 12 has been described herein, other ATAB carriers may be used.

The conventional I/C chips 14 are provided with solder balls 48 disposed along the surface. All the chips 14 are attached simultaneously to their corresponding ATAB 12 by conventional techniques, for example by high temperature nitrogen stream, as disclosed in U.S. Pat. No. 5,057,969 "Method for Bonding Thin Film Electronic Devices", issued to Amgeen et. al. Disposed along the bottom surface of the ATAB carrier are solder balls 50.

The solder balls 50 are joined to the pads 36 on the bottom surface 35 of an ATAB carrier 12 conventionally, preferably by a high speed stepping tool as disclosed in U.S. Pat. No. 5,057,969 "Method for Bonding Thin Film Electronic Devices", issued to Amgeen et. al. which is incorporated herein by reference.

Referring to FIG. 7A, before reflow, the high speed stepping welding tool WT is positioned against the pad on the opposite side of solder ball 50. The welding tool WT, "spot welds" the solder balls 50 so that they fuse with the gold layer 32 on the pads 36 or 37 and so solder reflows into a via and onto the pad opposite side as shown in FIG. 7B. The solder balls 50 are joined to the bottom surface 35 of the ATAB carriers 12 before or after the chips 14 are joined to the ATAB carrier 12.

If a heat sink is desired, then a thin strip of copper 56 or other material may be glued to the top of the chip 14 and to top of stiffeners 52 with a thermally conductive adhesive 58. Alternatively, the top of the chips 46 are coated with a thermal adhesive 58, and glued directly to both surfaces 35 on the ground plane 20 of the adjacent ATAB carrier 12. Each ATAB is formed with chips, stiffners and solder balls before it is incorporated into the pyramid.

The first ATAB carrier 12A is positioned so that the solder balls 50 disposed thereon align with and are positioned against the pads 44 atop a next lower adjacent ATAB carrier 12b. As shown in FIG. 8, the solder balls 50 from the ATAB carrier 12a are joined to the underlying ATAB carrier 12b utilizing the same high speed stepping tool as described in U.S. Pat. No. 5,057,969 "Method for Bonding Thin Film Electronic Devices", issued to Amgeen et. al. which is incorporated herein by reference. The welding tool WT is positioned against pad 36 and/or 37 on the back side of vias 26. The welding tool WT heats pad 36 and/or 37, the heat is conducted through the metallization 27 of via 26 to pad 44 which heats and reflows a portion of solder ball 50. The molten solder is sucked up through via 26 and spills over pad 36 and 37. The above process is repeated to join successive ATAB carriers together to provide a pyramid 10.

As shown in FIG. 7, the circuit board 60 is provided with pads 62 disposed on the top surface, the position of such pads having been designed to align with the solder balls 50 on the bottom of the pyramid 10. Low melting point solder 64 is screened atop the pads 62. This low melting solder 64, has a melting point below that of the solder balls. The solder balls 50 on the bottom of pyramid 10 are positioned to rest atop the solder coated pads 62 on the circuit board 60. The circuit board 60 and pyramid 10 are placed in an oven at a temperature sufficient to reflow the solder 64, but which is not hot enough to melt the solder balls 48 and 50, preferably about 160° C.–180° C. As a result the pyramid 10 is joined to board 60, to provide a multi-chip, multi-layer circuit board, also referred to as a multi-chip, multi-layer circuit package.

Although certain embodiments of this invention have been shown and described, various adaptations and modifications can be made without departing from the scope of the invention as defined in the appended claims.

What is claimed is:

1. A process for forming a multi-chip, multi-layer chip carrier and circuit board structure comprising the steps of;

a. providing a first chip carrier formed of a first flexible film of dielectric material having a top surface and bottom surface;

and having at least one I/C chip disposed on said top surface of said first flexible film;

electrical circuitry on said top surface of said first flexible film connected to said I/C chip;

a plurality of solder balls disposed on said bottom surface of said first flexible film;

electrically conducting vias extending from said top surface to said bottom surface interconnecting said circuitry on the top surface with at least some of said solder balls on the bottom surface of said first flexible film;

b. providing a second chip carrier formed of a second flexible film of dielectric material having a top surface and a bottom surface;

at least one I/C chip and a plurality of pads disposed on said top surface of said second flexible film;

electrical circuitry on said top surface of said second flexible film connected to said I/C chip and said pads;

a plurality of solder balls disposed on the bottom surface of said second flexible film;

electrically conducting vias extending from said top surface to said bottom surface interconnecting said circuitry on the top surface with at least some of said solder balls on the bottom surface of said second flexible film;

c. connecting said solder balls of the first chip carrier electrically and mechanically to said pads on the top surface of the second chip carrier;

d. providing a circuit board formed of a dielectric material having a top surface with a plurality of pads disposed on said top surface, and e. connecting said solder balls of said second chip carrier electrically and mechanically to said pads on said top surface of said circuit board.

2. The method as defined in claim 1 wherein said solder balls of said second chip carrier are joined to said pads on the top surface of said circuit board by applying a joining material having a melting point lower than said solder balls on said second chip carrier to the pads on said circuit board, and reflowing said joining material.

3. The method as defined in claim 2 wherein said joining material is a solder paste.

4. The method as defined in claim 1 wherein the vias in each film of dielectric material includes holes having metal plated on the surfaces thereof.

5. The method as defined in claim 4 wherein said solder balls of each of said chip carriers are reflowed into said vias.

6. The method as defined in claim 1 further characterized by attaching at least one stiffener to one surface of at least one chip carrier.

7. The method as defined in claim 6 wherein each stiffener is secured to the top surface of a chip carrier.

8. The structure as defined in claim 1 further characterized by securing a heat sink in thermal conducting relationship with at least one of said I/C chips.

9. The method as defined in claim 8 wherein each heat sink includes a strip of metal.

10. The method as defined in claim 9 wherein each strip of metal is bonded to an I/C chip by a thermally conducting adhesive.

11. The method as defined in claim 8 wherein said heat sink is formed by applying a thermal adhesive between at least one I/C chip on said second chip carrier and the second surface of said first chip carrier.

* * * * *